US012787744B2

(12) United States Patent
OBrien et al.

(10) Patent No.: US 12,787,744 B2
(45) Date of Patent: Nov. 3, 2026

(54) INTEGRATED CIRCUIT INTERCONNECT STRUCTURES INCLUDING COPPER-FREE VIAS

(71) Applicant: Intel Corporation, Santa Clara, CA (US)

(72) Inventors: Daniel B. OBrien, Beaverton, OR (US); Jeffrey S. Leib, Beaverton, OR (US); James Y. Jeong, Beaverton, OR (US); Chia-Hong Jan, Portland, OR (US); Peng Bai, Hillsboro, OR (US); Seungdo An, Portland, OR (US); Pavel S. Plekhanov, Portland, OR (US); Debashish Basu, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 585 days.

(21) Appl. No.: 17/521,760

(22) Filed: Nov. 8, 2021

(65) Prior Publication Data

US 2023/0143021 A1 May 11, 2023

(51) Int. Cl.

| | |
|---|---|
| ***H01L 23/522*** | (2006.01) |
| ***H01L 21/768*** | (2006.01) |
| ***H01L 23/532*** | (2006.01) |
| ***H10W 20/00*** | (2026.01) |
| ***H10W 20/41*** | (2026.01) |
| ***H10W 20/42*** | (2026.01) |

(52) U.S. Cl.

CPC ......... *H10W 20/42* (2026.01); *H10W 20/033* (2026.01); *H10W 20/056* (2026.01); *H10W 20/425* (2026.01)

(58) Field of Classification Search

CPC .................................................. H01L 23/5226

See application file for complete search history.

(56) References Cited

U.S. PATENT DOCUMENTS

2010/0078771 A1* 4/2010 Barth .................. H10W 20/023 257/659
2010/0159694 A1* 6/2010 Chandrashekar ............................ H01L 21/76877 257/E21.17
2012/0074574 A1* 3/2012 Barth .................. H10W 20/033 438/653

(Continued)

FOREIGN PATENT DOCUMENTS

CN 110970350 A * 4/2020 .......... H10W 20/425

OTHER PUBLICATIONS

Examination Report from European Patent Application No. 22200107.5 notified Mar. 25, 2025, 7 pgs.

(Continued)

*Primary Examiner* — Peter Bradford

(74) *Attorney, Agent, or Firm* — Essential Patents Group, LLP

(57) ABSTRACT

Integrated circuit interconnect structure compatible with single damascene techniques and that includes a non-copper via comprising metal(s) of low resistivity that can be deposited at low temperature in a manner that also ensures good adhesion. Metal(s) suitable for the non-copper via may have BCC crystallinity that can advantageously template favorable crystallinity within a diffusion barrier of the upper-level interconnect feature, further reducing electrical resistance of an interconnect structure.

7 Claims, 10 Drawing Sheets

(56) References Cited

U.S. PATENT DOCUMENTS

| | | | |
|---|---|---|---|
| 2014/0061918 A1 | 3/2014 | Jezewski et al. | |
| 2014/0117547 A1 | 5/2014 | Lin et al. | |
| 2018/0301373 A1 | 10/2018 | Yashar et al. | |
| 2020/0066645 A1* | 2/2020 | Farmer | H10P 14/432 |
| 2020/0135558 A1 | 4/2020 | Standaert et al. | |
| 2021/0035906 A1* | 2/2021 | Chen | H01L 21/76224 |
| 2023/0135806 A1* | 5/2023 | Kim | H10D 30/031 257/351 |

OTHER PUBLICATIONS

Extended European Search Report from European Patent Application No. 22200107.5 notified Mar. 3, 2023, 7 pgs.

* cited by examiner

INTEGRATED CIRCUIT INTERCONNECT STRUCTURES INCLUDING COPPER-FREE VIAS

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay associated with interconnects of an IC increases with the density of the interconnects.

FIG. 1A illustrates a conventional interconnect structure that includes a metal line 101 within a first interconnect level. A transverse width of metal line 101 has some lateral critical dimension CD1. A dielectric material 102 is over metal line 101, and a via opening 103 is subtractively patterned through dielectric material 102 in the z-dimension to expose a portion of metal line 101. Via 103 has a depth Dv associated with the thickness of dielectric material 102. A diameter of via 103 has some lateral critical dimension CD2. Often, CD2 is made smaller than CD1 by an amount sufficient to ensure via 103 will land upon metal line 101. The ratio of depth Dv to CD2 is referred to as the aspect ratio of via 103. Metal line width CD1 scales down as metal line density increases with increasing transistor density, and so CD2 must also scale down and the aspect ratio of via 103 increases.

As further illustrated in FIG. 1B, via 103 and trench 106 is filled with one or more metals to form a metal line 108 that extends in the x-y dimension to intersect conductive material in via 103 so that two interconnect levels are electrically connected. In this dual damascene example, a liner 105 is on surfaces of trench 106 and via 103. Liner 105 may include a barrier material to prevent diffusion/migration of a fill material 107 out of the interconnect structure, as any loss of fill material 107 is generally catastrophic to an integrated circuit. Liner material 105 may also include an adhesion material, instead of a barrier material, or in addition to a barrier material. Whether including a barrier material layer, an adhesion material layer, or both, liner material 105 often has significantly higher electrical resistance than fill material 107, which is typically copper. As structural dimensions scale, liner material 105 threatens to become a greater portion of an interconnect structure, leading to higher interconnect resistances.

With dual damascene interconnect technology, fill metal 107 is deposited (e.g., plated) into trench 106 and/or via 103 concurrently, and therefore liner material 105 need only be deposited once, prior to the fill of both via 103 and trench 106. However, because of continued interconnect feature scaling, dual damascene processing is becoming more challenging. In response to this challenge, IC fabrication processes are beginning to rely more heavily upon single damascene interconnect technology. In single damascene interconnect technology, the formation of vias and lines are separated. For example, a via opening may be defined in a dielectric material and then the via opening is filled with metallization to form the via. Subsequently, another dielectric layer is deposited over the via, and a trench is then defined in that dielectric layer and filled with line metallization. Since the trench exposes the via, another liner material may extend across a top interface of the via. As the liner material interface with a via can significantly increase the electrical resistance of an interconnect structure, interconnect structures fabricated according to single damascene techniques can suffer high electrical resistance.

Accordingly, single-damascene interconnect technology that permits the fabrication of interconnect structures having lower electrical resistance is commercially advantageous in the integrated circuit industry.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
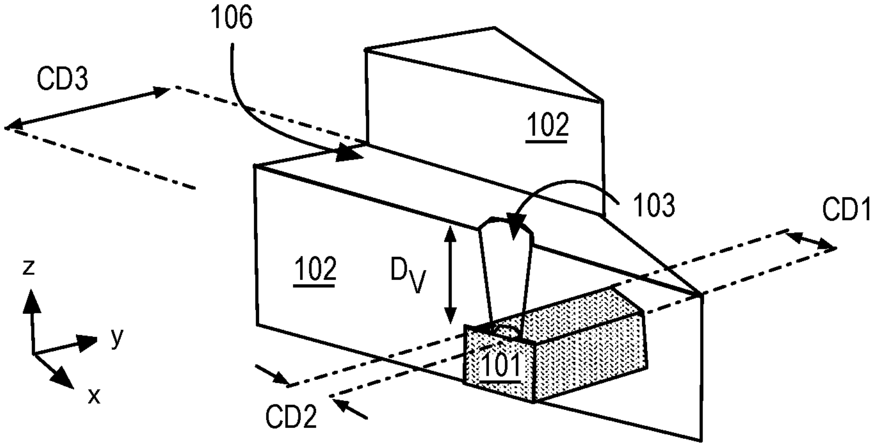
FIG. 1A (Prior Art)
FIGS. 1A and 1B illustrate isometric cross-sectional views of an IC interconnect structure, in accordance with convention.
Figure 1B:
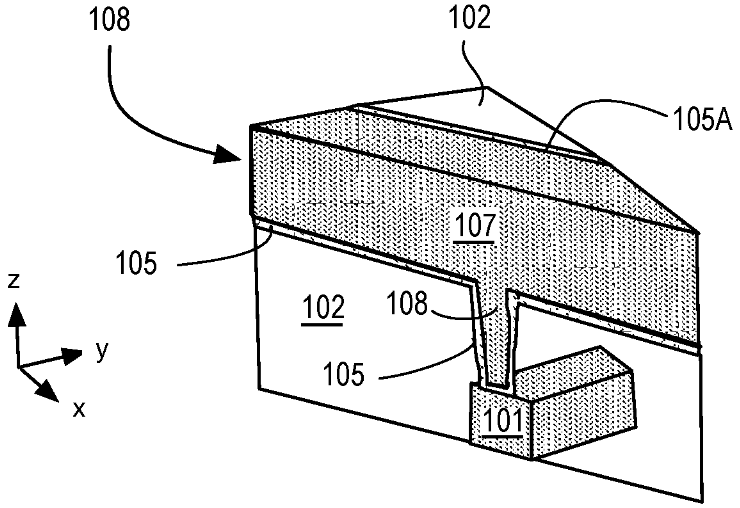
FIG. 1B (Prior Art)

One or more embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material disposed over or under another material may be directly in contact or may have one or more intervening materials. Moreover, one material disposed between two materials may be directly in contact with the two materials or may have one or more intervening materials. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than half. For example, a composition that is predominantly a first constituent means more than half of the composition is the first constituent (e.g., >50 at. %). The term "primarily" means the most, or greatest, part. For example, a composition that is primarily a first constituent means the composition has more of the first constituent than any other constituent. For a composition that is primarily first and second constituents, the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

Described below are examples of integrated circuit interconnect structures in which an upper-level metallization feature, such as a line, includes a liner at a bottom of the feature and on a sidewall of the feature. The liner mitigates the diffusion of fill metal from the feature into the surrounding dielectric material, and may improve adhesion to a surrounding dielectric material. Electrical resistance associated with the liner, and more particularly the diffusion barrier, depends at least in part on the extent of structural order in the thin film of the barrier material, particularly at the interface of underlying via metal. For example, the barrier material can be substantially amorphous (i.e., having no long-range structural order), or polycrystalline (e.g., having nano-scale to micro-scale crystal grains). Barrier material having (poly)crystallinity may also comprise one or more phases. A given phase is associated with a particular crystal structure, such as body centered cubic (BCC) or tetragonal, for example. Crystals of any phase within a barrier material may also have non-random orientation relative to some reference plane, and have some preferred orientation characterized as crystal texture. High resolution transmission electron microscopy (TEM) and/or x-ray diffraction (XRD) analysis techniques may be employed to quantify the prevalence of various crystallographic phases within a region of barrier material.

The phase content of a barrier material may impact its electrical resistance. In accordance with some embodiments herein, crystallinity of the barrier material may be templated from an underlying via metal to have more of a particular phase/crystal structure. In exemplary embodiments, a low-resistance phase is promoted within barrier material proximal to the interface of an underlying via metal. Accordingly, a portion of the barrier material proximal to the interface of the underlying via metal will have more of the low-resistance phase than is present in another portion of the barrier material distal from the interface. By increasing the low-resistance phase of the barrier material proximal to the via metal, electrical resistance of interconnect structures may be reduced. As described further below, the barrier material may have primarily BCC crystal structure in the low-resistance phase, while in other regions the barrier material has primarily tetragonal crystal structure. Differences in the phase may be readily identified through transmission electron microscopy (TEM) analysis, for example.

In further embodiments described below, via metal advantageously comprises metals other than copper (Cu), and that do not need a diffusion barrier. In absence of any diffusion barrier, a via may have a larger contact interface with a lower-level metallization feature. In accordance with embodiments herein, a titanium (Ti) and/or titanium nitride (TiN) adhesion layer may also be avoided in favor of an alternative metal, for example comprising primarily tungsten (W), or molybdenum (Mo). The deposition of via metal(s) in accordance with some embodiments herein may comprise more than one deposition technique to achieve good adhesion and low via resistance. The deposition techniques may be low temperature and therefore compatible with lower-level metallization, which may comprise Cu. As further described below, the via metal may template desirable crystallinity within the overlying barrier material and, in exemplary embodiments, is primarily BCC phase.

Figure 2:
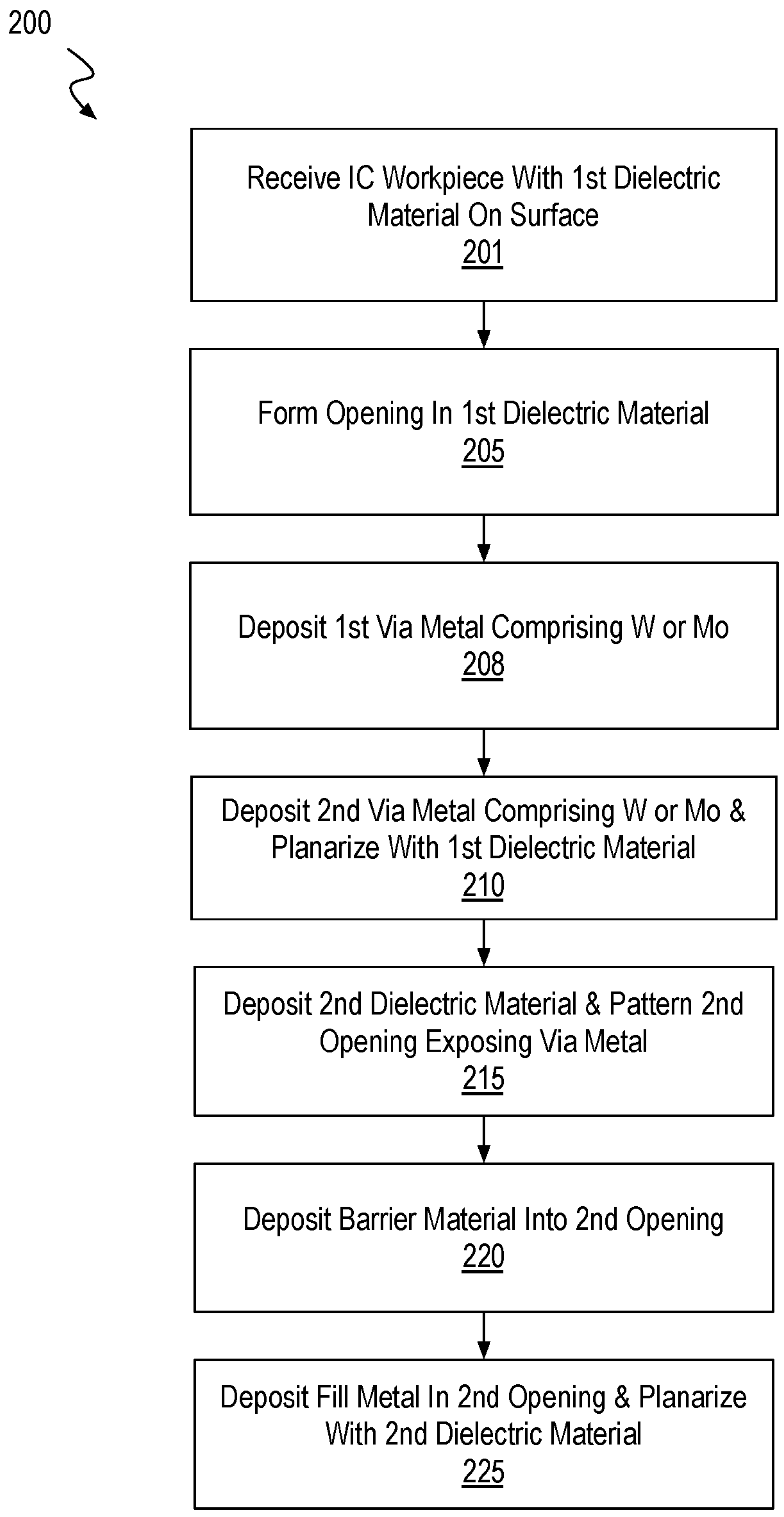
FIG. 2 is a flow chart of single damascene methods of fabricating an integrated circuit interconnect structure, in accordance with some embodiments.

FIG. 2 is a flow chart of methods 200 for fabricating an integrated circuit interconnect structure, in accordance with some embodiments. FIG. 3A-7A illustrate a plan view of a portion of an IC interconnect structure evolving as methods 200 are practiced, in accordance with some single-damascene embodiments while FIG. 3B-7B further illustrate a cross-sectional view of the evolution of the IC interconnect structure illustrated in FIG. 3A-7A, respectively.

Referring first to FIG. 2, methods 200 begin at block 201 with receiving a workpiece, such as a large format (e.g., 300-450 mm) semiconductor wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more underlying device layers including a semiconductor material layer, and may also have one or more interconnect levels interconnecting devices (e.g., transistors) of the device layers. A dielectric material is on a top surface of the workpiece, for example covering the underlying interconnect level(s) and device level layer(s).

At block 205, methods 200 continue with forming an opening in the dielectric material, for example with any patterned subtractive etch process suitable for chemical composition of the dielectric material. Any single-step or multi-step anisotropic reactive ion etch (RIE) process (e.g., based on a $C_xF_y$ plasma chemistry) may be practiced form the opening, as embodiments are not limited in this respect. Although the geometry of the opening may vary with implementation, the opening is referred to herein as a "via" opening because it exposes a lower-level metallization feature underlying the dielectric material.

Methods 200 continue with filling the via opening with one or more metals other than copper (Cu). At block 208, a first layer of via metal is deposited within the via opening. In exemplary embodiments, the first layer of via metal is deposited with a low temperature process, for example below 325° C., ensuring the via metallization is compatible with underlying metallization features (which may comprise copper, or another metal with a similar stability threshold). In exemplary embodiments, block 208 comprises depositing W or Mo.

In some embodiments where the first layer of via metal comprises Mo, the first layer may be formed with physical vapor deposition (PVD), thermal atomic layer deposition (ALD), or plasma enhanced chemical vapor deposition (PECVD). For PVD embodiments, Mo is advantageously sputtered, and then made more conformal by resputtering through an application of a voltage bias. For thermal ALD embodiments, Mo may be conformally deposited with a metal-organic precursor with suitable reactivity at process temperatures below 325° C. For PECVD embodiments, Mo may be conformally deposited with an inorganic precursor (e.g., chlorine based) and a direct plasma energized, for example, with an RF source.

In some alternative embodiments where the first layer of via metal comprises W, the first layer may be formed with PVD or PECVD. For PVD embodiments, W is advantageously sputtered, and then made more conformal by resputtering through an application of a voltage bias. For PECVD embodiments, a tungsten carbon nitride (WNC) compound is advantageously deposited conformally with a metal-organic precursor (e.g., fluorine-free) and a direct plasma energized, for example, with an RF source.

Figure 3A:
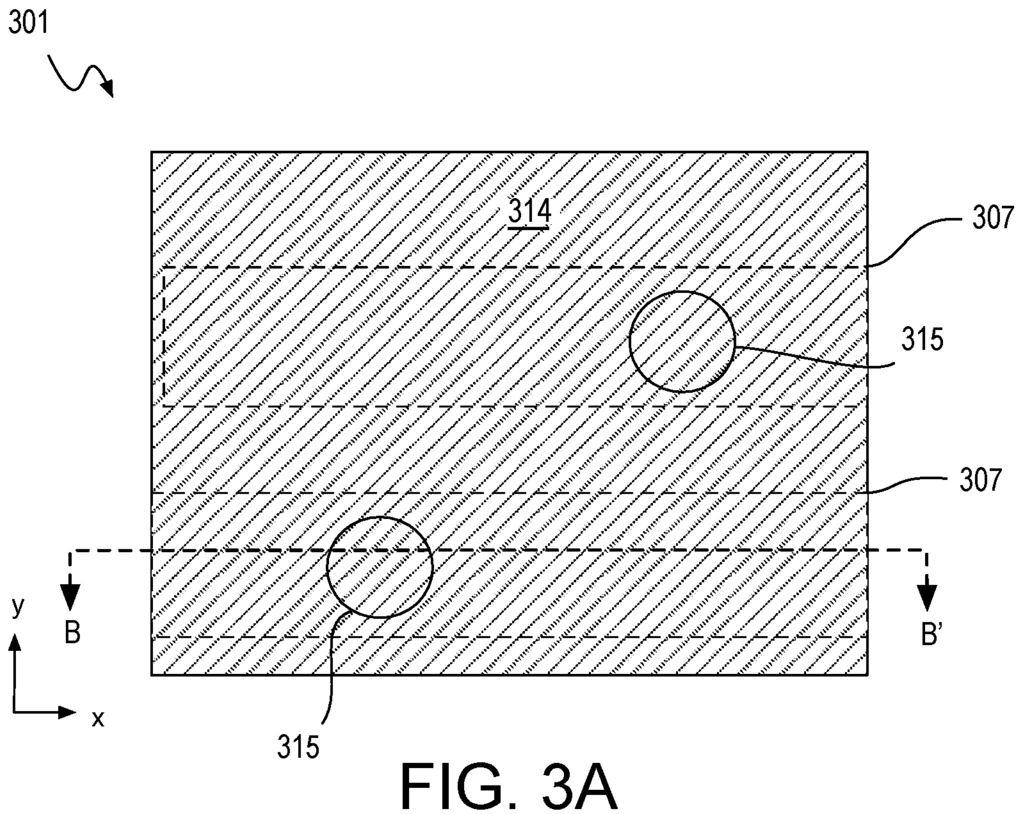
FIGS. 3A, 4A, 5A, 6A, 7A and 8A illustrate a plan view of a portion of an IC interconnect structure evolving as the methods illustrated in FIG. 2 are practiced, in accordance with some single-damascene embodiments.
Figure 3B:
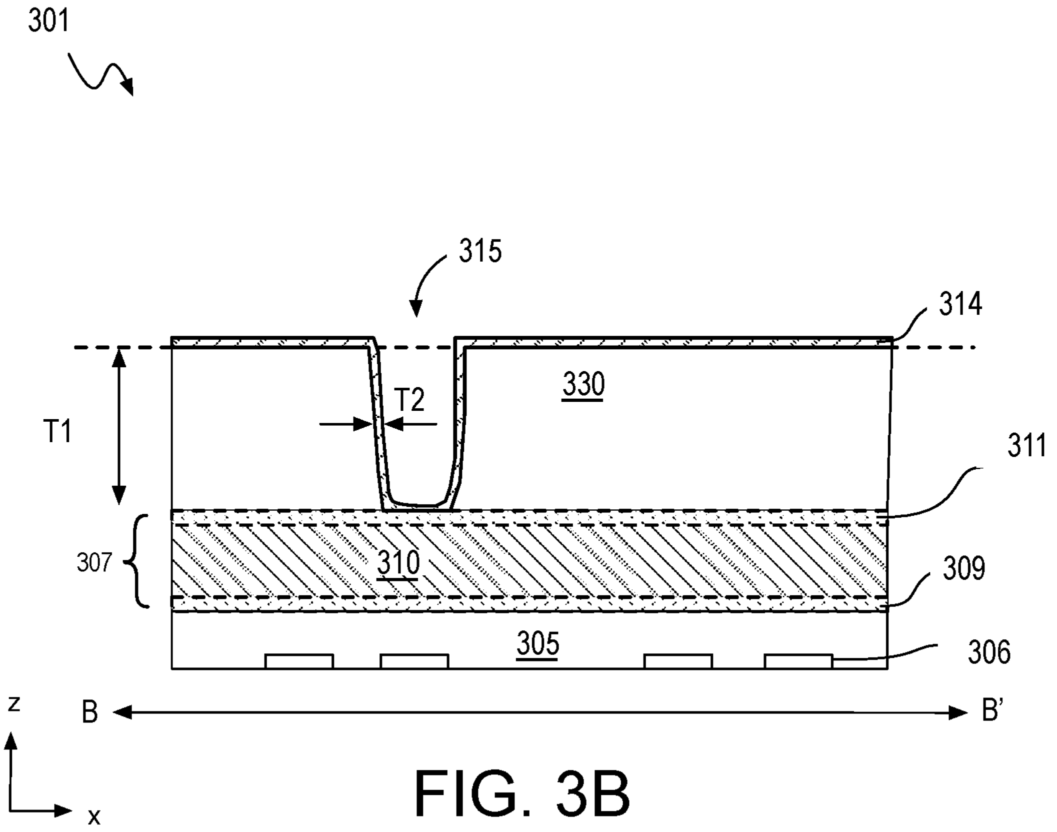
FIGS. 3B, 4B, 5B, 6B, 7B and 8B illustrate a cross-sectional view of a portion of an IC interconnect structure evolving as the methods illustrated in FIG. 2 are practiced, in accordance with some single-damascene embodiments.
Figure 4A:
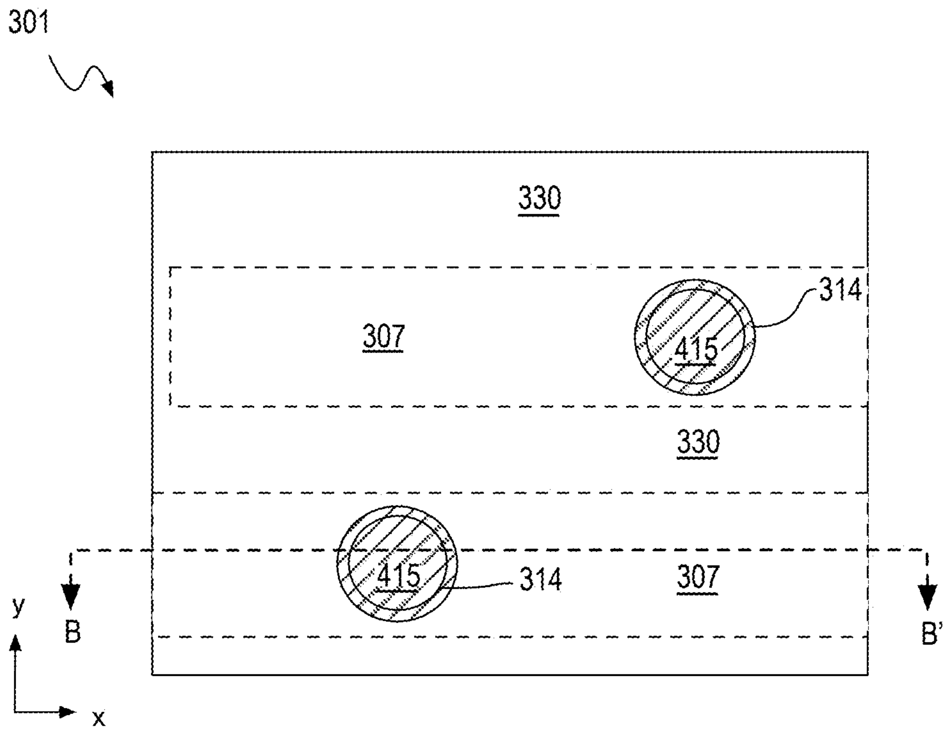
Figure 4B:
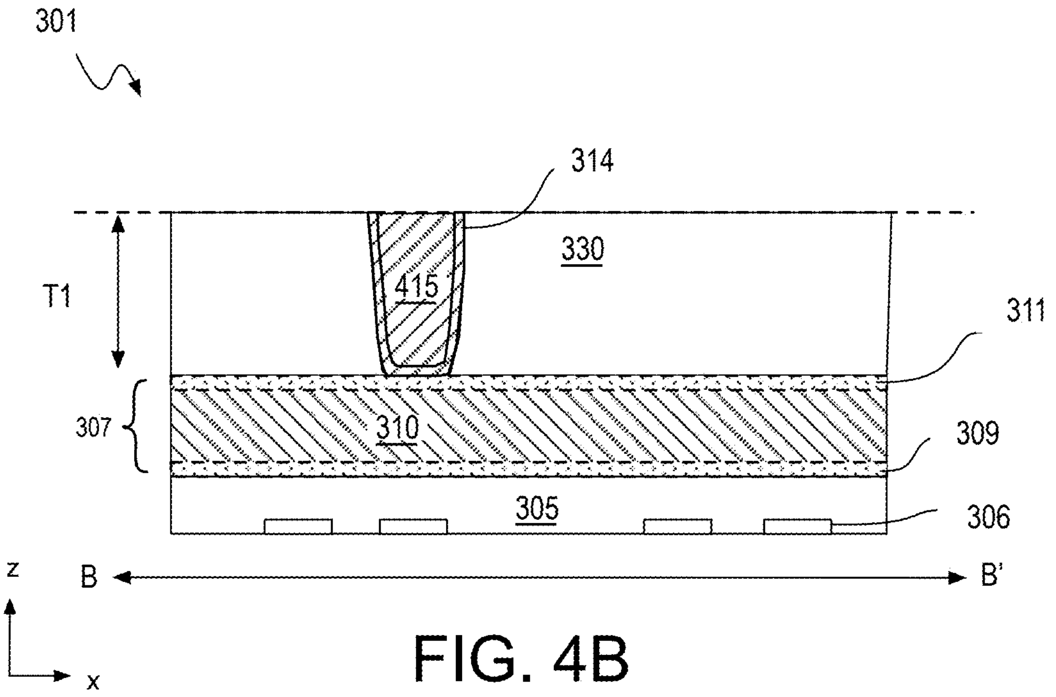

FIGS. 3A and 3B illustrates an exemplary interconnect structure 301 following the practice of methods 200 (FIG. 2) through block 208. As shown in FIG. 3A and FIG. 3B, interconnect structure 301 includes a via opening 315 that extends through a thickness T1 of dielectric material 330. Thickness T1 may vary with implementation, but in some exemplary embodiments is 10 nm-50 nm. Dielectric material 330 may be deposited as a flowable oxide, for example, and have a substantially planar top surface. Dielectric material 330 may be any dielectric material(s) suitable as an IC interlayer dielectric material (ILD). In some exemplary embodiments, dielectric material 330 is a low-k dielectric material, for example having a relative permittivity less than about 3.5. Dielectric material 330 may also be a conventional dielectric material a somewhat higher relative permittivity in the range of 3.5-4.0. In some specific examples, dielectric material 330 is any of SiO, SiON, SiOC, SiOCN, hydrogen silsesquioxane (HSQ), methyl silsesquioxane (MSQ), polyimide, polynorbornene, or benzocyclobutene.

The underlying metallization feature (e.g., a line) 307 is exposed by via opening 315. Metallization feature 307 is in a lower interconnect level below dielectric material 330, and therefore illustrated in dashed line in FIG. 3A. Metallization feature 307 may have any architecture and include any number of material layers. In the illustrated example, metallization feature 307 includes a barrier material 309, a fill metal 310, and a cap material 311. In FIG. 3B, barrier material 309 and cap material 311 are illustrated with dashed line to emphasize they are optional and could be omitted from metallization feature 307. Fill metal 310 may be any metal of low resistivity, with one example being copper. If present, barrier material 309 may comprise another metal and one or more of nitrogen, oxygen, or carbon. In some examples, barrier material 309 comprises Ti, W, or Ta, and may further comprise N (e.g., TaN). Barrier material 309 may also comprise Co (e.g., pure Co, or alloy of Co). If present, cap material 311 may also comprise another metal, such as, tungsten, titanium, or cobalt, or an alloy thereof. In some exemplary embodiments, cap material 311 comprises Co.

As further shown in FIG. 3B, interconnect structure portion 301 is over a portion of an underlying substrate that includes a device layer 305. Within device layer 305 are a plurality of devices 306. In exemplary embodiments, devices 306 are metal-oxide-semiconductor field effect transistor (MOSFET) structures. However, devices 306 may also be other transistor types, such as, but not limited to other FET architectures, or bipolar junction transistors. Devices 306 may also be other devices that include one or more semiconductor junctions (e.g., diodes, etc.).

As shown in FIGS. 3A and 3B, a first layer of via metal 314 is deposited to a thickness T2, which may vary, but in some examples is approximately 1 nm. Depending on the embodiment, via metal 314 comprises primarily W or Mo. Depending on the deposition technique employed, via metal 314 may be substantially pure Mo, substantially pure W, or may be a tungsten carbon nitride (WCN) compound. Even for tungsten carbon nitride embodiments, via metal 314 is primarily W to ensure low electrical resistance. In some advantageous tungsten carbon nitride embodiments, W content is at least 50 at. %. As one example, W content is approximately 50 at. % while both C content and N content are approximately 25 at. %. Notably, it has been found that the addition of carbon and nitrogen to via metal 314 improves adhesion while a high tungsten content ensures a low resistivity.

Returning to FIG. 2, methods 200 continue at block 210 where a second layer of via metal is deposited over the first layer of via metal. In exemplary embodiments, the second layer of via metal is again deposited with a low temperature process, for example below 325° C., ensuring the via metallization is compatible with underlying metallization. In some embodiments, the second layer of via metal is deposited to a thickness sufficient to substantially fill the via opening.

In advantageous embodiments, block 210 also comprises depositing primarily Mo or W. Accordingly, a second layer comprising primarily Mo may be deposited upon a first layer comprising primarily W, or a second layer comprising primarily W may be deposited on a first layer comprising primarily Mo. In other embodiments, a second layer comprising primarily Mo may be deposited on a first layer comprising primarily Mo, or a second layer comprising primarily W may be deposited on a first layer comprising primarily W. Additionally, the deposition technique practiced at block 210 may, or may not, be different than the deposition technique practiced at block 208 regardless of whether the primary metal deposited at block 210 is the same or different than the primary metal deposited at block 210.

In some embodiments, block 210 comprises depositing W or Mo by PVD, CVD or ALD. For PVD embodiments, W or Mo may be deposited substantially as described above for block 208. In some advantageous embodiments, W or Mo is deposited by ALD with $H_2$ as a first precursor. Tungsten CVD or ALD embodiments may further rely on $WF_6$ as a second precursor. Molybdenum CVD or ALD embodiments may further enlist an inorganic (e.g., chlorine based) Mo precursor or metal-organic precursor.

Following deposition, the layers of via metal may be planarized with the surrounding dielectric material, for example with any suitable chemical/mechanical planarization/polishing process to define a via with the surrounding dielectric material. FIGS. 3A and 3B illustrates an exemplary interconnect structure 301 following the practice of methods 200 (FIG. 2) through block 210. As shown in FIG. 3A and FIG. 3B, interconnect structure 301 includes a via metal 415 that substantially fills the via opening.

Via metal 415 advantageously possesses crystallinity that will serve as a suitable template for crystallization of an upper-level metallization feature that interfaces with via metal 415. In exemplary embodiments, via metal 415 comprises primarily W or Mo. The W or Mo is advantageously substantially pure, and is primarily BCC phase as deposited. Although the amount of BCC phase within via metal 415 may vary, in advantageous embodiments via metal 415 is predominantly BCC phase (e.g., 60%-80%, or more).

Depending on the embodiment, via metal 415 may have the same primary metal constituent as via metal 314, or not. For example, in some embodiments, both via metal 314 and via metal 415 are primarily tungsten. While via metal 415 is advantageously substantially pure W, via metal 314 may either be WCN, or also substantially pure W. Although substantially pure, via metal 415 may include an impurity, such as fluorine, indicative of a CVD or ALD deposition process. Notably, for embodiments where via metal 314 is WCN and via metal 415 is W, low electrical resistance may be attributable to large grain size of the W via metal 415. For example, whereas W deposited upon a Ti or TiN liner may have a mean grain diameter of only 10-12 nm, W deposited upon WCN was found to have a mean grain diameter of 20-25 nm.

In other embodiments, both via metal 314 and via metal 415 are primarily molybdenum. For such embodiments, the via metal may be homogeneous aside from impurities present in via metal 415 indicative of a CVD or ALD deposition. A filled via may therefore appear to be substantially liner-free. In other embodiments where via metal 314 is primarily Mo and via metal 415 is substantially pure W, the via may be considered to have a Mo liner and a W fill. Alternative embodiments where via metal 314 is primarily W and via metal 415 is substantially pure Mo, the via comprises a Mo fill with a W or WCN liner.

Returning to FIG. 2, methods 200 continue at block 215 where another dielectric material is deposited and patterned to have another opening that exposes the via metal(s). The dielectric material deposited at block 215 may include one or more material layers deposited by any deposition technique(s) as embodiments are not limited in this respect. The opening patterned at block 215 may have any geometry, for example substantially the same geometry as the via metal or a significantly larger geometry.

Figure 5A:
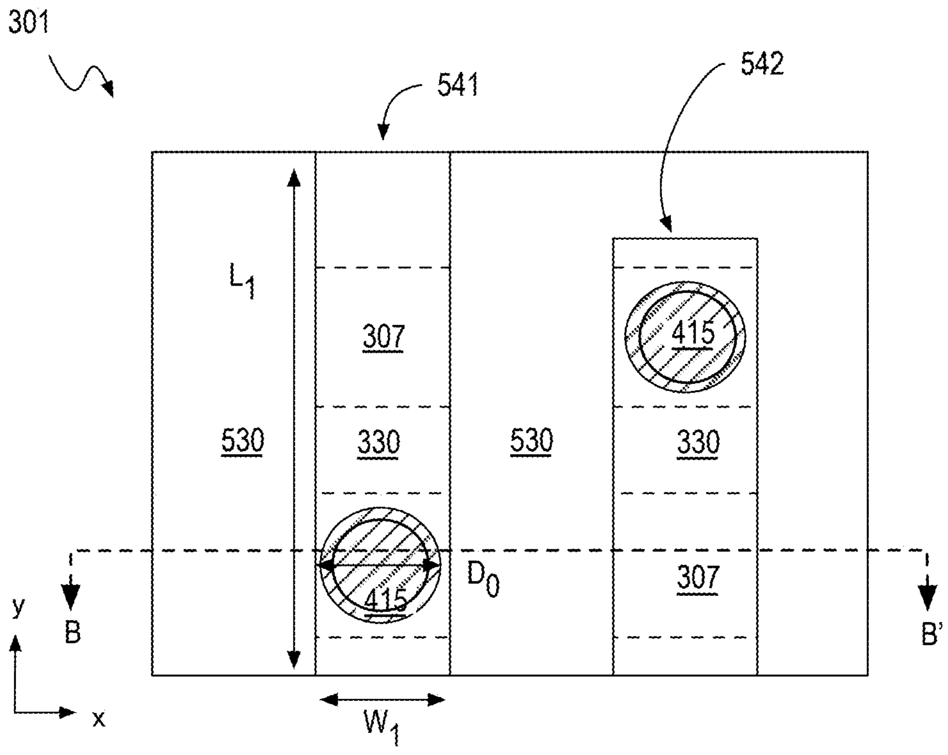
Figure 5B:
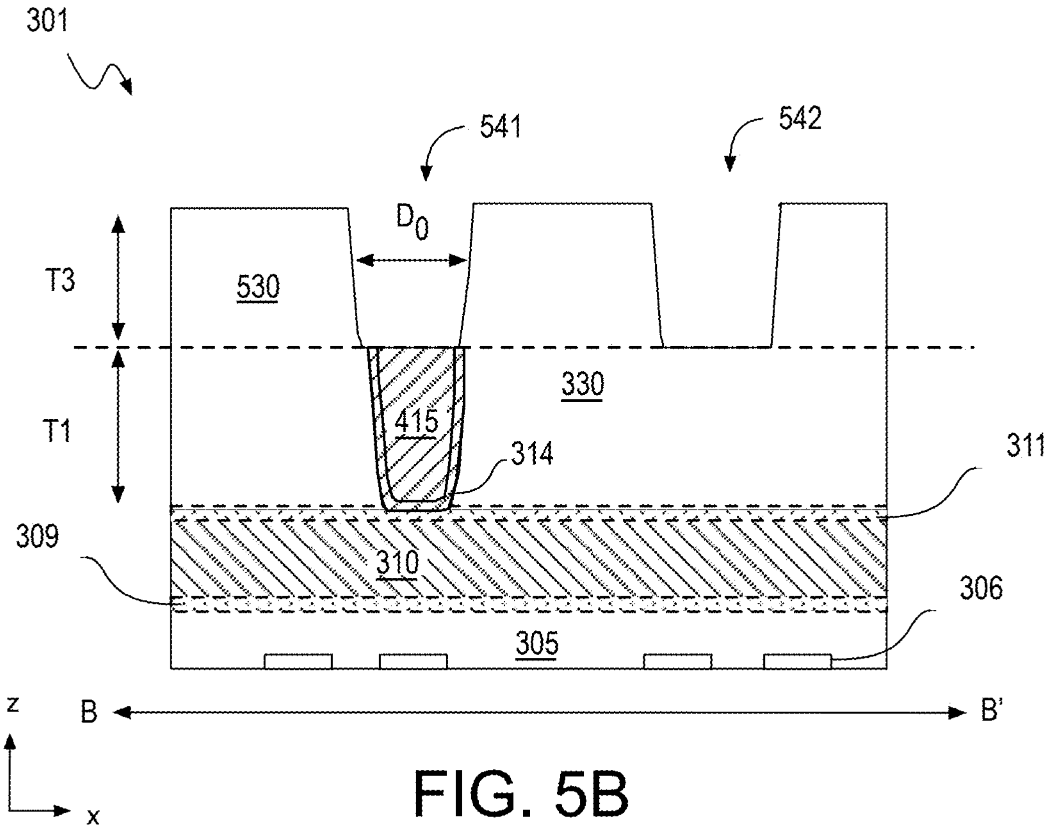

FIG. 5A and FIG. 5B further illustrate an example where interconnect structure portion 301 has been processed through block 215 (FIG. 2). As shown in FIGS. 5A and 5B, interconnect structure portion 301 further includes a trench 541 over via metal 415, within a thickness T3 of dielectric material 530. Dielectric material 530 may have any of the exemplary compositions described above for dielectric material 330. In some embodiments dielectric material 530 has substantially the same composition as dielectric material 330. A stop layer dielectric of different composition than that of either dielectric material 330 or dielectric material 530 may be present between dielectric materials 330 and 530, and is denoted by a dashed line in FIG. 5B.

Thickness T3 may again vary with implementation, but in some exemplary embodiments is 10-50 nm, or more. Another trench 542 laterally spaced apart from trench 541 has a cross-section shown in FIG. 3B that is representative of a cross-section of trench 541 out of the plane of FIG. 5B where there is no via metal 415. As shown in FIG. 3A, trench 541 has a longitudinal length $L_1$ and a transverse width $W_1$. In exemplary embodiments, longitudinal length $L_1$ is significantly (e.g., 3×) larger than transverse width $W_1$ Although not illustrated, trench 541 has ends somewhere beyond the perimeter of interconnect structure portion 301. Trench 542 is substantially parallel to trench 541, but with a shorter longitudinal length to further illustrate a trench end. Via metal 415 has a maximum lateral diameter $D_0$, which may vary with implementation, but is generally significantly smaller than the length of a trench (e.g., diameter $D_0$ is significantly smaller than longitudinal length $L_1$.

Returning to FIG. 2, methods 200 continue at block 220 where a barrier material is deposited as at least part of a liner within the opening formed at block 215. One or more liner material layers may be deposited at block 220 with either area selective or non-selective process(es). For selective deposition processes, deposition may proceed preferentially on "growth" surfaces at higher rates than on "non-growth" surfaces. In some non-selective embodiments, barrier material is deposited by PVD. In other non-selective embodiments, barrier material is deposited by atomic layer deposition (ALD). In regions where the barrier material is deposited in contact with the via metal, the barrier material may be advantageously templated by the via metal to have a crystallinity, phase content, and/or texture associated reduced electrical resistivity. Such templating may promote favorable microstructure during the deposition of the barrier material. The duration of block 220 may be predetermined to achieve a threshold minimum layer thickness needed as a diffusion barrier, and ideally, that entire thickness will develop favorable microstructure associated with low electrical resistivity.

Figure 6A:
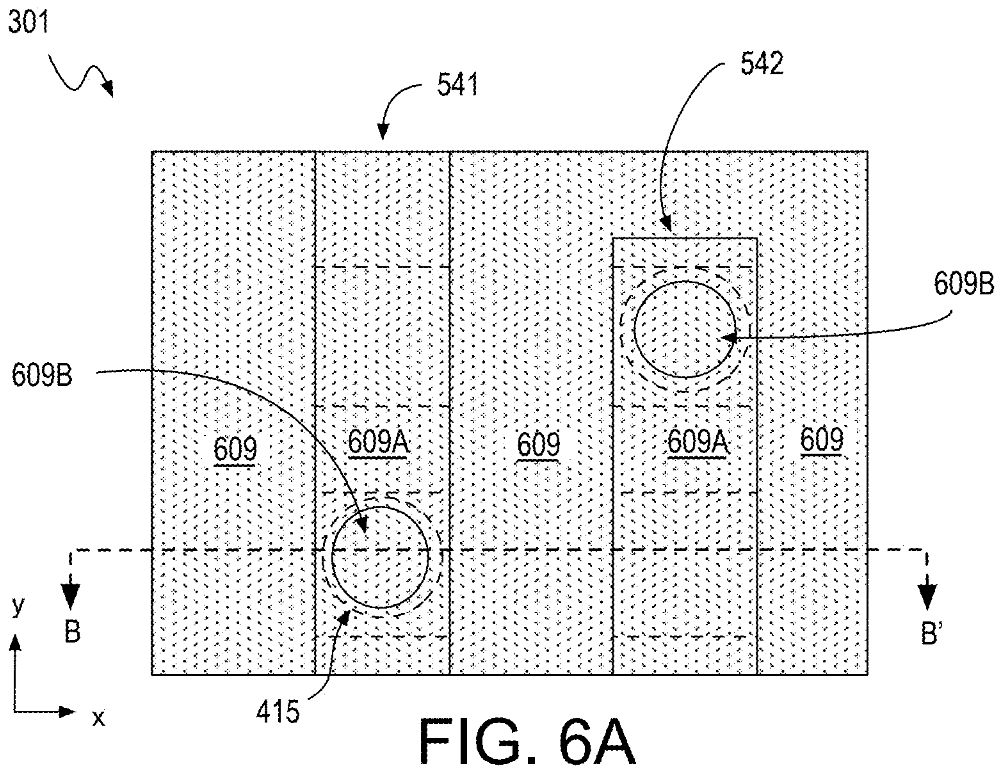
Figure 6B:
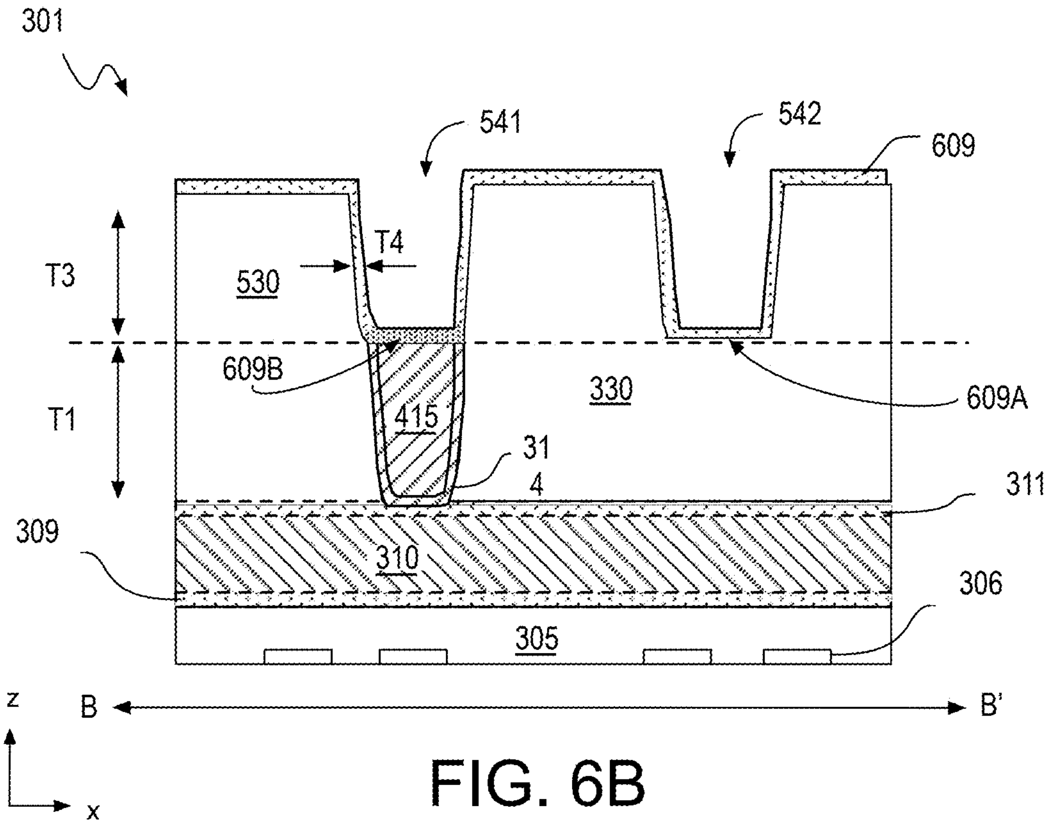

In the example further illustrated in FIG. 6A and FIG. 6B, interconnect structure 301 has been processed through block 220 (FIG. 2). As shown in FIGS. 6A and 6B, a barrier material 609 includes a first portion 609A in contact with dielectric material 330 (and/or dielectric material 530) at a bottom of trench 542. Barrier material 609 has a second portion 609B in contact with via metal 415 at a bottom of trench 541. Barrier material 609 has a thickness T4 on a sidewall of dielectric material 530 sufficient to function as a diffusion barrier. In some exemplary embodiments, sidewall thickness T4 is at least 1.5 nm (e.g., 2-5 nm).

Barrier material 609 may have any composition known to be suitable as an interconnect diffusion barrier. In some examples, barrier material 609 comprises a refractory metal, such as Ta. A Ta barrier material may be deposited by PVD, for example. In advantageous embodiments, barrier material 609 is substantially pure metal (e.g., pure Ta). However, in alternative embodiments barrier material 609 may also be a metallic compound further including at least one of Si, N, C, or O with one specific example being TaN, which may be deposited by PVD or ALD, for example.

For embodiments where via metal 415 possesses an appropriate grain structure and barrier material 609 has a suitable composition, via metal 415 advantageously promotes crystal structure within a barrier material portion 609B during the deposition of barrier material 609 to result in lower electrical resistance. In exemplary embodiments where barrier material 609 is substantially pure Ta, barrier material portion 609B has a significantly greater amount of the low-resistance BCC phase than within barrier material portion 609A. In contrast, barrier material portion 609A may have primarily tetragonal crystal structure because barrier material portion 609A interfaces with the amorphous dielectric material 530 and/or 330, and lacks a favorable template. The advantage of a via metal template can be seen for Ta, which in tetragonal phase has a resistivity of nearly 200 μOhm-cm, but only ~35 μOhm-cm in BCC phase. The portion of barrier material 609 spanning a cross-section of the via may therefore be modified to have lower electrical resistivity, which can significantly lower via resistance. Notably, not all barrier materials are amenable to such templating. TaN, for example, may not significantly template in this manner. Accordingly, via resistance improvements may be less for embodiments where the barrier material does not template favorably, and/or electrical resistance is not a strong function of the material's phase/crystal structure.

Returning to FIG. 2, methods 200 continue at block 225 where a fill metal is deposited over the barrier material. The fill metal(s) may be deposited after any number of supplemental liner materials are deposited upon the barrier layer. Any deposition process known to be suitable for depositing a particular fill metal into a trench and/or via opening may be practiced at block 225. In some examples, an electrolytic plating process is practiced at block 225 to deposit a fill metal comprising Cu. In further embodiments, multiple deposition processes may be practiced at block 225. For example, an electrolytic plating process may be preceded by PVD of a seed layer and/or wetting layer. The seed/wetting layer may have substantially the same composition as a remainder of the fill, or the seed/wetting layer may have a composition distinct from the remainder of the fill. Deposition of the fill metals may also comprise chemical vapor deposition (CVD), ALD or electroless plating. For example, a wetting material layer comprising Cu or Co may be deposited by PVD, CVD, ALD or electroless plating prior to electrolytic plating of a fill metal comprising predominantly copper.

Block 225 is completed with a planarization of the fill metal and the liner material (layers) to expose a top surface of the dielectric material surrounding the trench or via opening. The planarization process may remove any fill metal and liner material from the dielectric material in regions beyond a perimeter of the upper-level metallization feature.

Figure 7A:
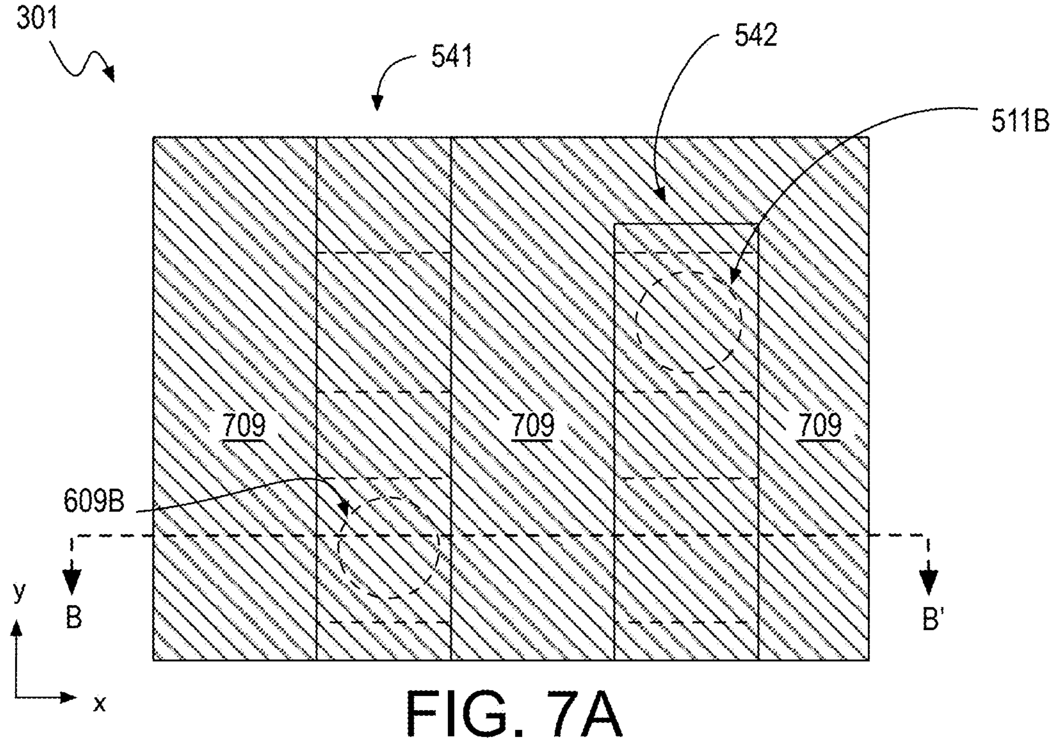
Figure 7B:
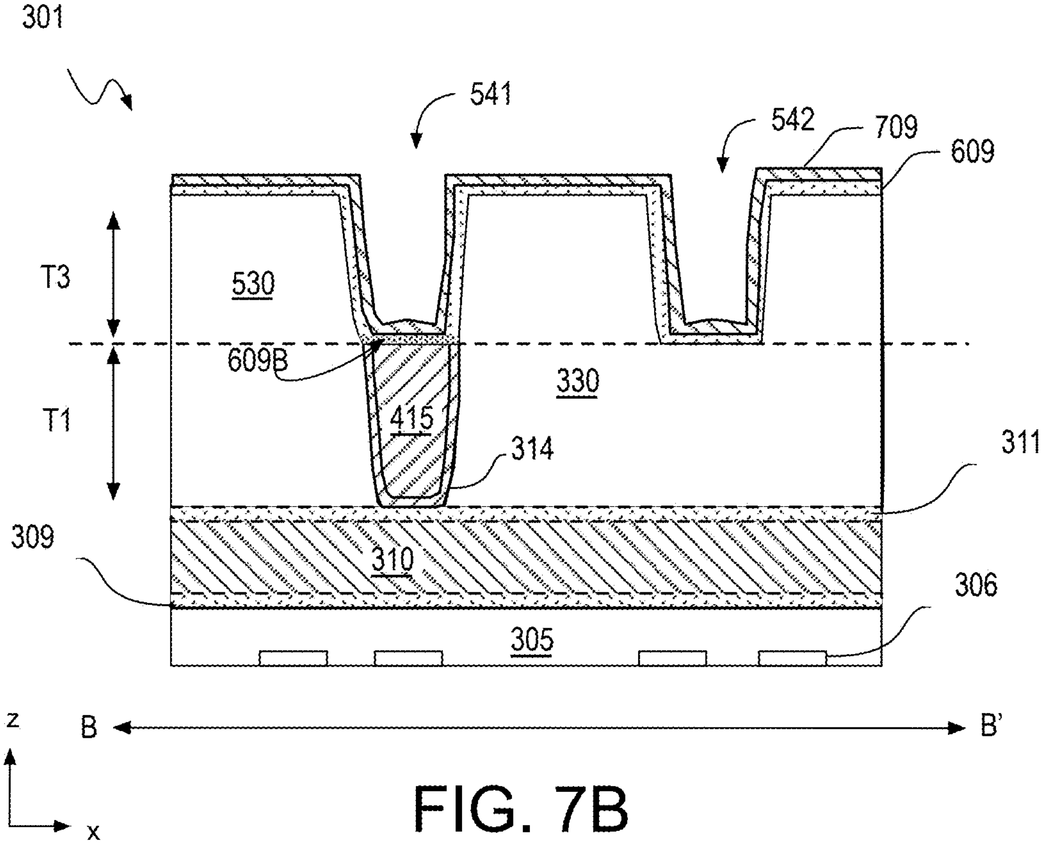

In the example further illustrated in FIG. 7A and FIG. 7B, interconnect structure 301 has been processed through block 225 (FIG. 2). As shown in FIGS. 7A and 7B, a first fill metal 709 is in contact with barrier material 609. Fill metal layer 709 may function as a wetting layer improving the fill of another fill metal subsequently deposited, and/or facilitating a subsequent electrolytic plating process, for example. In some embodiments, fill metal layer 709 comprises predominantly Co. In some other embodiments, fill metal layer 709 comprises predominantly Cu Although fill metal layer 709 is shown as a substantially conformal layer, it may instead completely fill trenches 541 and 542, for example as a function of the thickness of fill metal layer 709 and the lateral dimensions of trenches 541, 542.

Figure 8A:
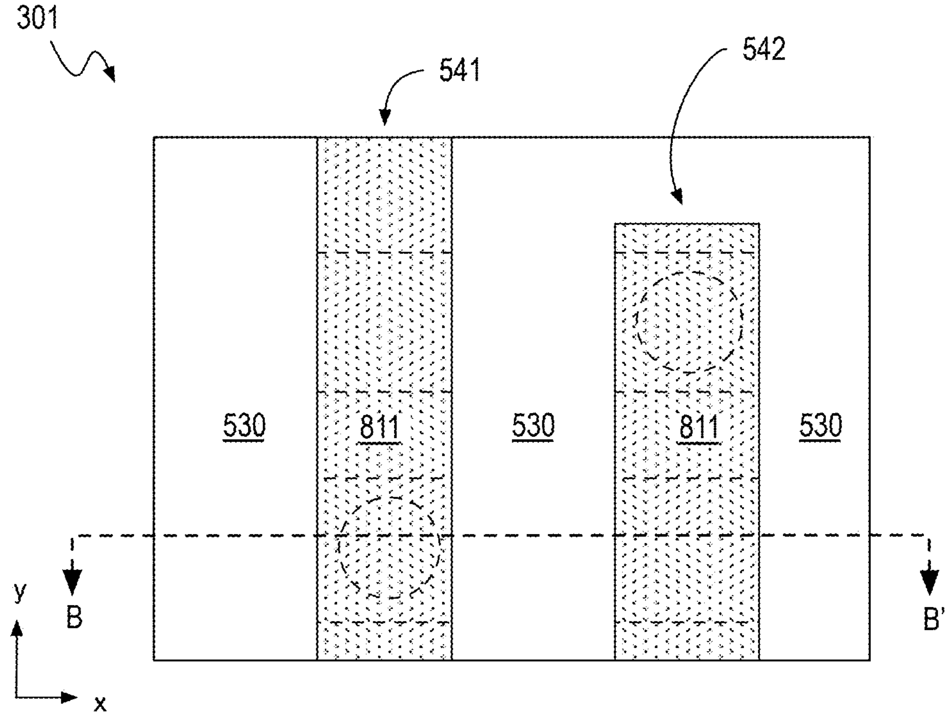
Figure 8B:
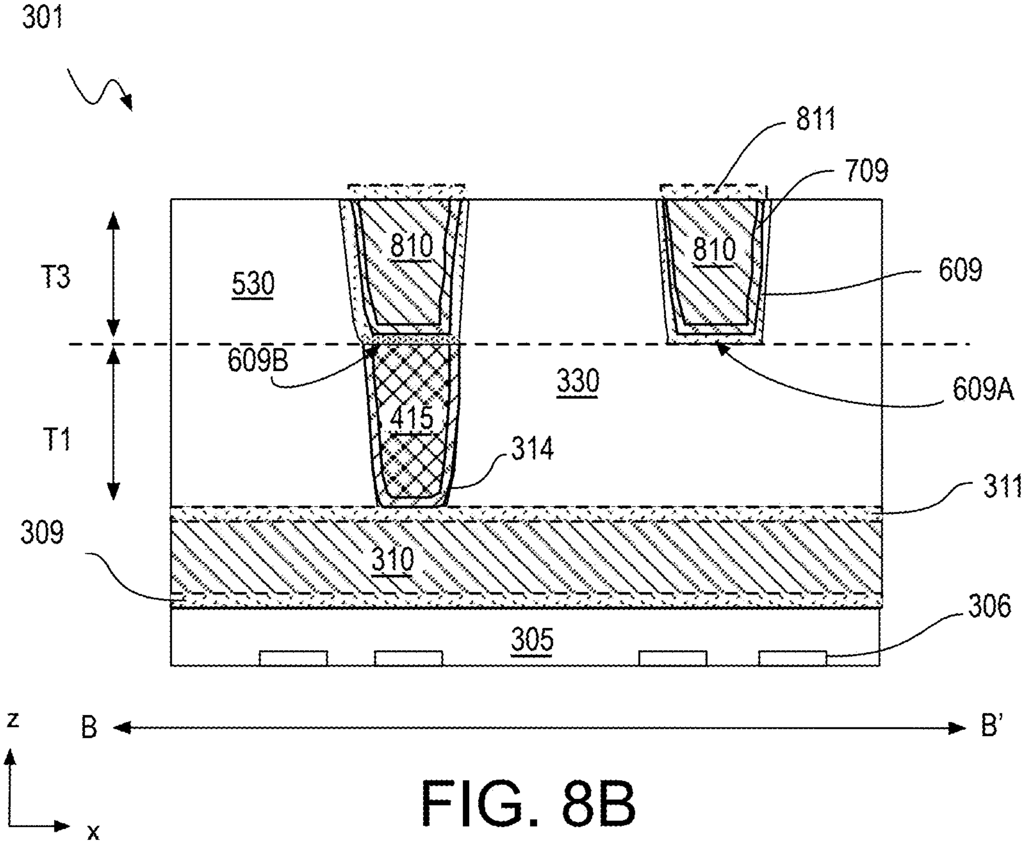

FIG. 8A and FIG. 8B, further illustrate interconnect structure 301 after deposition of another fill metal 810 that substantially backfills trenches 541 and 542. In some exemplary embodiments, fill metal 810 is predominantly Cu, or an alloy thereof. As shown, fill metal layer 709 and fill metal 810, as well as barrier material 609, are substantially planar with a top surface of dielectric material 530. As also illustrated, interconnect structure 301 may further include a cap metal 811 over at least fill metal 810. Cap metal 811 may have substantially the same composition as cap layer 311, with cap metal 811 comprising Co in one example.

Interconnect structure 301 is therefore a single damascene structure associated with one level of interconnect metallization comprising an upper-level line metallization with a barrier material having enhanced BCC phase proximal to via metal that is further coupled to a lower-level line metallization through a via having lower resistance attributable to metal(s) employed. An interconnect structure's electrical resistance, and more particularly via electrical resistance, may be accordingly reduced. IC circuitry may therefore display a lower RC delay and higher overall performance, for example.

Interconnect structure 301 may be augmented to have any number of such levels of interconnect metallization as needed for a particular IC. Interconnect structure 301 may be incorporated into any IC circuitry as a portion of any IC chip or die that may be singulated from a workpiece following the completion of any conventional processing not further described herein.

Figure 9:
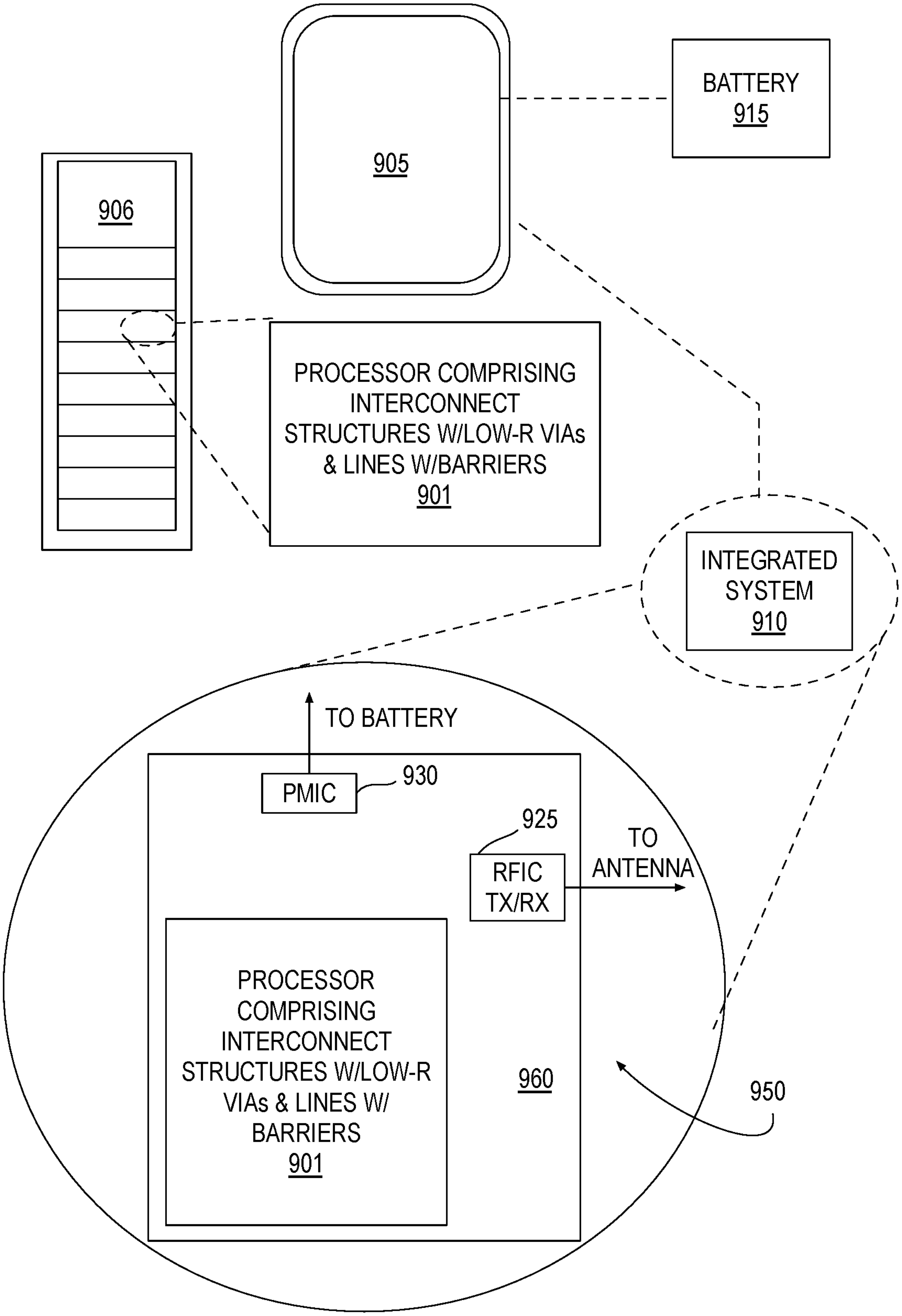
FIG. 9 illustrates a mobile computing platform and a data server machine employing an IC including a single-damascene interconnect structure, in accordance with some embodiments.

FIG. 9 illustrates a mobile computing platform 905 and a data server computing platform 906 employing an IC including interconnect structures with low resistance non-copper vias and lines with templated barriers, for example as described elsewhere herein. The server platform 906 may be any commercial server, for example including any number of high-performance computing platforms disposed within a rack and networked together for electronic data processing, which in the exemplary embodiment includes a microprocessor 901 including interconnect structures with low resistance non-copper vias and lines with templated barriers, for example as described elsewhere herein.

The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915. At least one IC of chip-level or package-level integrated system 910 includes an interconnect structure with low-resistance vias and lines with templated barriers, for example as described elsewhere herein. In the example shown in expanded view 950, integrated system 910 includes microprocessor 901 including interconnect structures with low resistance vias and lines with templated barriers, for example as described elsewhere herein. Microprocessor 901 may be further coupled to a board 960, a substrate, or an interposer. One or more of a power management integrated circuit (PMIC) 930, or an RF (wireless) integrated circuit (RFIC) 925 including a wideband RF (wireless) transmitter and/or receiver (TX/RX) may be further coupled to board 960.

Functionally, PMIC 930 may perform battery power regulation, DC-to-DC conversion, etc., and so has an input coupled to battery 915 and with an output providing a current supply to other functional modules (e.g., microprocessor 901). As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 10:
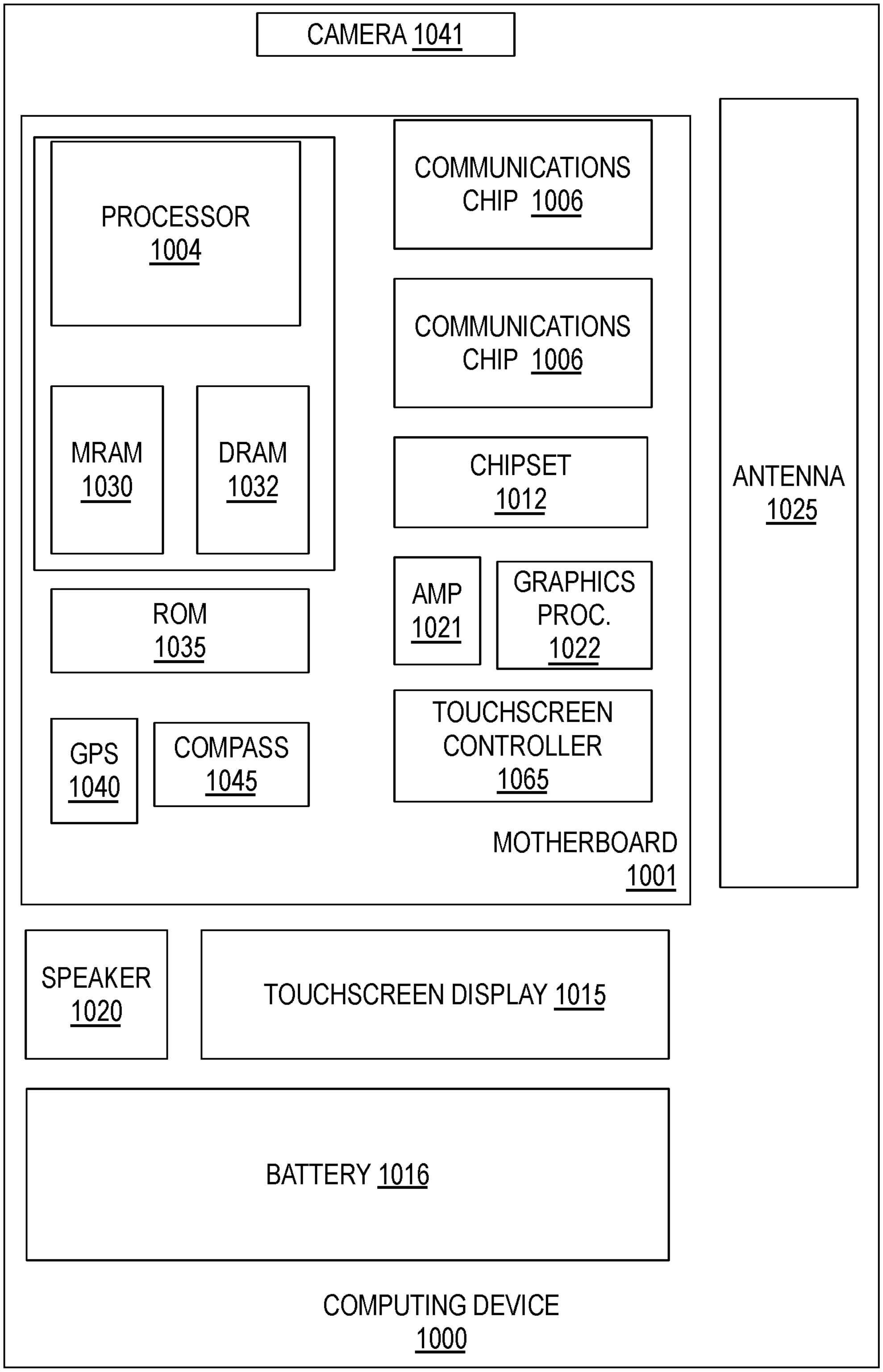
FIG. 10 is a functional block diagram of an electronic computing device, in accordance with some embodiments.

FIG. 10 is a functional block diagram of an electronic computing device 1000, in accordance with an embodiment of the present invention. Computing device 1000 may be found inside platform 905 or server platform 906, for example. Device 1000 further includes a motherboard 1001 hosting a number of components, such as, but not limited to, a processor 1004 (e.g., an applications processor). Processor 1004 may be physically and/or electrically coupled to motherboard 1001. In some examples, processor 1004 includes interconnect structures with low-resistance non-copper vias and lines with templated barriers, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1001. In further implementations, communication chips 1006 may be part of processor 1004. Depending on its applications, computing device 1000 may include other components that may or may not be physically and electrically coupled to motherboard 1001. These other components include, but are not limited to, volatile memory (e.g., DRAM 1032), non-volatile memory (e.g., ROM 1035), flash memory (e.g., NAND or NOR), magnetic memory (MRAM 1030), a graphics processor 1022, a digital signal processor, a crypto processor, a chipset 1012, an antenna 1025, touchscreen display 1015, touchscreen controller 1065, battery 1016, audio codec, video codec, power amplifier 1021, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth), or the like. In some exemplary embodiments, at least one of the functional blocks noted above include interconnect structures with low via resistance, for example as described elsewhere herein.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) interconnect structure comprises a lower-level metallization feature comprising copper, a non-copper via in contact with the lower-level metallization feature, and an upper-level metallization feature. The upper-level metallization feature comprises a fill metal, and a barrier material. A first portion of the barrier material over the via is primarily in a first phase having body centered cubic (BCC) crystal structure.

In second examples, for any of the first examples the via comprises a via metal primarily in the first phase.

In third examples, for any of the second examples the via metal has a mean grain diameter over 20 nm.

In fourth examples, for any of the second through third examples a second portion of the barrier material between the fill metal and an underlying dielectric material is primarily in a second phase, and the second phase has primarily tetragonal crystal structure.

In fifth examples, for any of the first through fourth examples the via metal comprises predominantly W or Mo, the fill metal comprises Cu, and the barrier material comprises predominantly Ta.

In sixth examples, for any of the first through fifth examples the via metal comprises a fill metal comprising substantially pure W, and a liner between the fill metal and the first dielectric material, the liner comprising Mo or W.

In seventh examples, for any of the sixth examples the liner comprises at least 50 at. % W.

In eighth examples, for any of the sixth through seventh examples the liner comprises W, C and N.

In ninth examples, for any of the sixth through eighth examples, the fill metal further comprises F, and the liner comprises substantially pure W, free of F.

In tenth examples, for any of the second through ninth examples the via metal comprises predominantly Mo in contact with a sidewall of the first dielectric material.

In eleventh examples, a computer platform comprises a power supply, and an integrated circuit (IC) coupled to the power supply. The IC comprises a device layer comprising a plurality of transistors comprising one or more semiconductor materials, and a plurality of interconnect levels. The interconnect levels further comprises a lower-level metallization feature, a first dielectric material over the lower-level metallization feature, and a via through the first dielectric material, and in contact with the lower-level metallization feature. The via comprises a metal of primarily W or Mo in contact with a sidewall of the first dielectric material. The interconnect levels further comprises a second dielectric material over the first dielectric material, and an upper-level metallization feature comprising a fill metal comprising Cu, and a barrier material comprising substantially pure Ta.

In twelfth examples, for any of the eleventh examples the IC comprises a microprocessor.

In thirteenth examples, a method of fabricating an integrated circuit (IC) interconnect structure comprises depositing a first layer of a via metal in contact with the lower-level metallization feature, the first layer of via metal comprising primarily W or Mo. The method comprises depositing a second layer of via metal upon the first layer of via metal, the second layer of via metal comprising substantially pure W or Mo. The method comprises forming, from the layers of via metal, a via through a dielectric material. The method comprises forming an upper-level metallization feature by depositing a barrier material comprising predominantly Ta on the via, and depositing a fill metal over the barrier material.

In fourteenth examples, for any of the thirteenth examples depositing the second layer of via metal comprises a physical vapor deposition (PVD), a chemical vapor deposition (CVD), or an atomic layer deposition (ALD) of W or Mo.

In fifteenth examples, for any of the thirteenth through fourteenth examples depositing the second layer of via metal comprises CVD or ALD, and wherein the CVD or ALD comprises heating the IC interconnect structure to no more than 325° C.

In sixteenth examples, for any of the fifteenth examples the CVD or ALD further comprises providing $H_2$ as a first precursor.

In seventeenth examples, for any of the sixteenth examples the CVD or ALD further comprises providing $WF_6$ as a second precursor.

In eighteenth examples for any of the fifteenth through seventeenth examples the CVD or ALD further comprises providing an inorganic or metal-organic precursor comprising Mo as a second precursor.

In nineteenth examples, for any of the thirteenth through eighteenth examples depositing the first layer of via metal comprises atomic layer deposition (ALD) of Mo, physical vapor deposition (PVD) of W or Mo, or plasma enhanced chemical vapor deposition (PECVD) of Mo, or of a W compound further comprising C and N.

In twentieth examples, for any of the nineteenth examples depositing the first layer of via metal comprises PECVD of W, C and N and wherein the PECVD comprises heating the IC interconnect structure to no more than 325° C.

In twenty-first examples, for any of the thirteenth through twentieth examples depositing the fill metal comprises plating Cu, the lower-level metallization feature comprises a second fill metal comprising predominantly Cu, and a second barrier material comprising Ta, and the via metal is deposited in contact with either the second fill metal or a cap metal comprising Co.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) interconnect structure, comprising:
- a lower-level metallization feature comprising copper;
- a non-copper via in contact with the lower-level metallization feature; and
- an upper-level metallization feature comprising:
  - a fill metal comprising Cu; and
  - a barrier material comprising predominantly Ta, wherein:
    - a first portion of the barrier material over the via is primarily in a first phase having body centered cubic (BCC) crystal structure;
    - the via comprises a via metal primarily in the first phase; and
    - the via metal comprises a fill metal comprising substantially pure W, and a liner comprising W, C and N.

2. The IC interconnect structure of claim 1, wherein the fill metal has a mean grain diameter over 20 nm.

3. The IC interconnect structure of claim 1, wherein a second portion of the barrier material between the fill metal and an underlying dielectric material is primarily in a second phase having tetragonal crystal structure.

4. The IC interconnect structure of claim 1, wherein the liner comprises at least 50 at. % W.

5. An integrated circuit (IC) interconnect structure, comprising:
- a lower-level metallization feature comprising Cu;
- a non-copper via in contact with the lower-level metallization feature; and
- an upper-level metallization feature comprising:
  - a fill metal comprising Cu and F; and
  - a barrier material comprising predominantly Ta, wherein:
    - a first portion of the barrier material over the via is primarily in a first phase having body centered cubic (BCC) crystal structure;
    - the via comprises a via metal primarily in the first phase;
    - the via metal comprises a fill metal comprising substantially pure W, and a liner comprising substantially pure W, and free of F.

6. The IC interconnect structure of claim 5, wherein the fill metal has a mean grain diameter over 20 nm.

7. The IC interconnect structure of claim 5, wherein a second portion of the barrier material between the fill metal and an underlying dielectric material is primarily in a second phase having tetragonal crystal structure.

* * * * *